United States Patent
Faurie et al.

(10) Patent No.: US 10,043,662 B2
(45) Date of Patent: Aug. 7, 2018

(54) METHOD OF FORMING SEMICONDUCTOR SUBSTRATE

(71) Applicants: Jean-Pierre Faurie, Valbonne (FR); Bernard Beaumont, Le Tignet (FR)

(72) Inventors: Jean-Pierre Faurie, Valbonne (FR); Bernard Beaumont, Le Tignet (FR)

(73) Assignee: SAINT-GOBAIN CRISTAUX ET DETECTEURS, Courbevoie (FR)

( * ) Notice: Subject to any disclaimer, the term of this patent is extended or adjusted under 35 U.S.C. 154(b) by 187 days.

(21) Appl. No.: 13/681,119

(22) Filed: Nov. 19, 2012

(65) Prior Publication Data

US 2013/0143394 A1 Jun. 6, 2013

Related U.S. Application Data

(60) Provisional application No. 61/562,369, filed on Nov. 21, 2011.

(51) Int. Cl.
*H01L 21/02* (2006.01)

(52) U.S. Cl.
CPC .... *H01L 21/02389* (2013.01); *H01L 21/0254* (2013.01); *H01L 21/02647* (2013.01); *H01L 21/02658* (2013.01)

(58) Field of Classification Search
CPC .............. H01L 33/0062; H01L 33/0066
USPC ....................................... 438/479
See application file for complete search history.

(56) References Cited

U.S. PATENT DOCUMENTS

| | | |
|---|---|---|
| 5,679,152 A | 10/1997 | Tischler |
| 5,814,239 A | 9/1998 | Kaneko et al. |
| 6,274,518 B1 | 8/2001 | Yuri et al. |
| 7,118,934 B2 | 10/2006 | Oshima et al. |
| 7,462,893 B2 | 12/2008 | Han et al. |
| 7,829,913 B2 | 11/2010 | Shibata et al. |
| 2001/0016404 A1* | 8/2001 | Hayakawa ............... 438/496 |
| 2001/0045661 A1* | 11/2001 | Yang et al. ............. 257/763 |
| 2001/0050408 A1* | 12/2001 | Bernstein et al. ...... 257/532 |
| 2002/0030200 A1* | 3/2002 | Yamaguchi ........ B82Y 20/00 257/184 |
| 2002/0137248 A1* | 9/2002 | Ogawa ............ C30B 29/403 438/29 |
| 2003/0017685 A1* | 1/2003 | Usui et al. ............. 438/483 |
| 2003/0057434 A1* | 3/2003 | Hata et al. ............. 257/103 |

(Continued)

FOREIGN PATENT DOCUMENTS

| | | |
|---|---|---|
| JP | H10335749 A | 12/1998 |
| JP | H1135397 A | 2/1999 |
| JP | 2008124262 A | 5/2008 |

OTHER PUBLICATIONS

The International Search Report and the Written Opinion received from the International Searching Authority (ISA/KR) for International Application No. PCT/US2012/065886, dated Apr. 1, 2013, 8 pages.

*Primary Examiner* — Lex Malsawma
*Assistant Examiner* — Geoffrey Ida
(74) *Attorney, Agent, or Firm* — Abel Law Group, LLP (57) ABSTRACT

A method of forming a semiconductor substrate including forming a base layer of a Group 13-15 material on a growth substrate during a growth process, forming a mask having mask regions and gap regions overlying the base layer during the growth process, and preferentially removing a portion of the base layer underlying the mask during the growth process.

19 Claims, 3 Drawing Sheets

(56) References Cited

U.S. PATENT DOCUMENTS

| | | |
|---|---|---|
| 2005/0030821 A1 | 2/2005 | Tai |
| 2006/0046502 A1* | 3/2006 | Ngo et al. .................... 438/757 |
| 2007/0246700 A1* | 10/2007 | Park ............................ 257/13 |
| 2008/0105903 A1 | 5/2008 | Kodama et al. |
| 2008/0176366 A1 | 7/2008 | Mita et al. |
| 2008/0219910 A1 | 9/2008 | Kasai et al. |
| 2010/0001375 A1 | 1/2010 | Yu et al. |
| 2010/0123118 A1 | 5/2010 | Hu et al. |
| 2010/0124814 A1* | 5/2010 | Arena ......................... 438/504 |
| 2010/0244197 A1 | 9/2010 | Arena et al. |
| 2010/0314642 A1* | 12/2010 | Kudo et al. ................... 257/98 |
| 2010/0320462 A1* | 12/2010 | Koukitu ................ C30B 25/02 257/49 |
| 2012/0018758 A1* | 1/2012 | Matioli et al. ................. 257/98 |

* cited by examiner

METHOD OF FORMING SEMICONDUCTOR SUBSTRATE

CROSS-REFERENCE TO RELATED APPLICATION

This application claims priority under 35 U.S.C. § 119(e) to U.S. Patent Application No. 61/562,369 entitled "Semiconductor Substrate and Method of Forming," by Faurie et al., filed Nov. 21, 2011, which is assigned to the current assignee hereof and incorporated herein by reference in its entirety.

BACKGROUND

Field of the Disclosure

The following is directed to a method of forming a semiconductive substrate, and particularly, a method of forming a semiconductive substrate using a mask.

Description of the Related Art

Semiconductive-based compounds, including Group 13-15 materials, such as gallium nitride (GaN), ternary compounds, such as, indium gallium nitride (InGaN) and gallium aluminum nitride (GaAlN), and even the quaternary compounds (AlGaInN) are direct band gap semiconductors. Such materials have been recognized as having great potential for short wavelength emission, and thus suitable for use in the manufacturing of light emitting diodes (LEDs), laser diodes (LDs), UV detectors, and high-temperature electronics devices.

However, the development of such semiconductive materials has been hampered by difficulties surrounding the processing of such materials, particularly the formation of high-quality single crystalline forms of the material, which are required for manufacturing of short wavelength emission electronics. GaN is not found as a naturally occurring compound, and thus cannot be melted and pulled from a boule like silicon, gallium arsenide, or sapphire, because at usual pressures its theoretical melting temperature exceeds its dissociation temperature. As an alternative, the industry has turned to formation of bulk GaN crystals using epitaxial growth processes. However, problems still remain with the epitaxial approach, including the formation of suitable low defect density bulk GaN material.

The existence of extended defects (threading dislocations, stacking faults, and antiphase boundaries) leads to significantly deteriorated performances and results in a shortened operating lifetime of devices. More specifically, the dislocations behave as non-radiative centers, thus reducing the light-emitting efficiency of light-emitting diodes and laser diodes made from these materials. These dislocations also increase the dark current. Although threading dislocations have not prevented the development of high-brightness light-emitting diodes, the dislocations cause excessive reverse-bias leakage currents in p-n junction devices such as high-electron-mobility transistors, field-effect transistors and other electronic devices. Further, the dislocations can act as strong scattering centers for carriers, thus reducing the mobility of electrons and holes, limiting the performance of many semiconductor devices.

SUMMARY

A method of forming a semiconductor substrate including forming a base layer of a Group 13-15 material on a growth substrate during a growth process, forming a mask comprising mask regions and gap regions overlying the base layer during the growth process, and preferentially removing a portion of the base layer underlying the mask during the growth process.

According to another aspect, a method of forming a semiconductor substrate includes a) forming a base layer of a Group 13-15 material on a growth substrate, b) forming a mask comprising a nitride material overlying the base layer, and c) etching and preferentially removing portions of the base layer and the mask after forming the mask. The steps a), b), and c) can be conducted in-situ during a single operation within a growth chamber.

In another aspect, a method of forming a semiconductor substrate can include forming a base layer comprising GaN on a growth substrate during a growth process, the growth substrate having a sapphire base substrate and a buffer layer overlying the growth substrate and disposed between the base substrate and the base layer. The method further includes forming a mask comprising mask regions and gap regions between the mask regions overlying the base layer, and preferentially removing a portion of the base layer underlying the mask.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

The following is generally directed to substrate materials, and particular, substrates comprising semiconductive materials, and which can include a plurality of semiconductive layers (i.e., semiconductive substrates) and methods of forming such articles. The semiconductive substrate may include Group 13-15 materials including for example gallium nitride (GaN). It will be appreciated that reference to Group 13-15 materials, include compounds including at least one element from Group 13 of the Periodic Table of Elements and at least one element from Group 15 of the Periodic Table of Elements based on the IUPAC Periodic Table of Elements, version dated Jan. 21, 2011.

Figure 1:
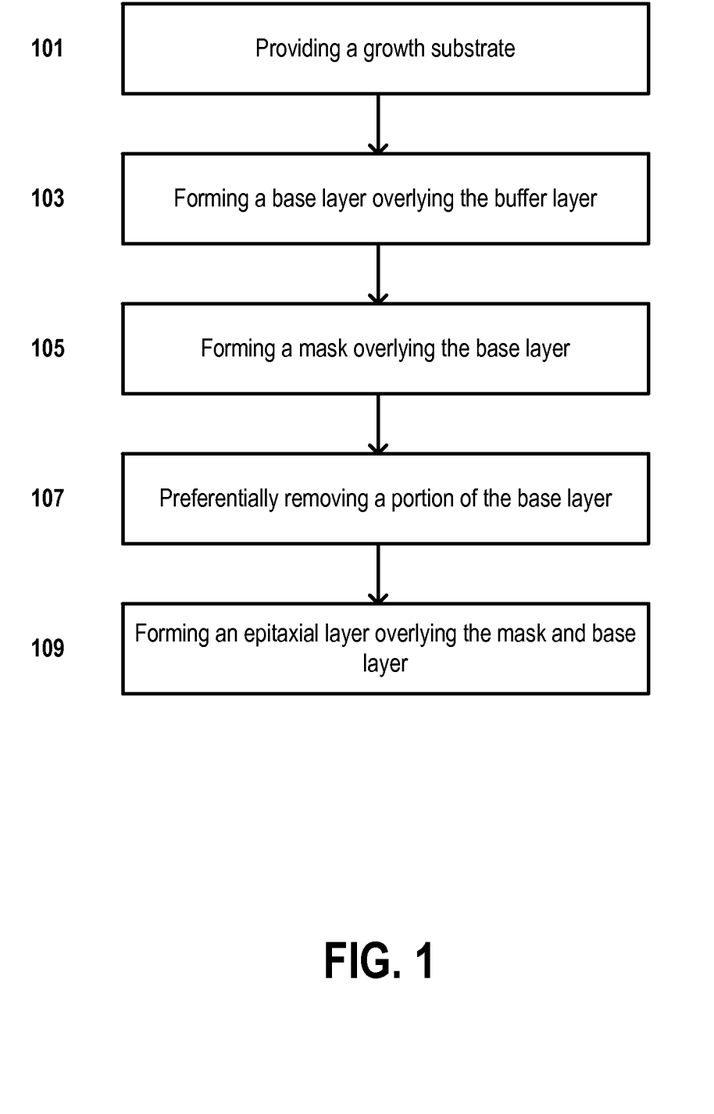
FIG. 1 includes a flowchart providing a method of forming a semiconductive substrate material for an electronic device in accordance with embodiment.

FIG. 1 includes a flow chart illustrating a method of forming a semiconductive substrate in accordance with the embodiment. As illustrated, the process can be initiated at step 101 by providing a growth substrate. The growth substrate can be a structure suitable for supporting a plurality of layers thereon. The growth substrate may further provide a structure and surface suitable for conducting heteroepitaxial growth of semiconductive layers thereon. In accordance with one embodiment, the growth substrate can be a composite article, including more than one structure or type of material. For example, the growth substrate can include a base substrate and a buffer layer overlying the base substrate.

According to one embodiment, the base substrate can include an inorganic material. Some suitable inorganic materials can include oxides, carbides, nitrides, borides, oxycarbides, oxyborides, oxynitrides, and a combination thereof. In certain instances the base substrate can include alumina, and more particularly, may include single crystal alumina (i.e., sapphire). One embodiment utilizes a substrate consisting essentially of sapphire.

Figure 2A:
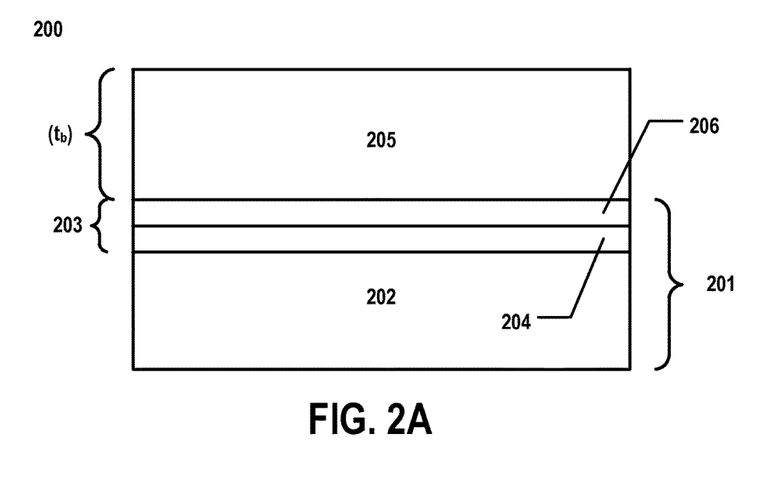
FIGS. 2A-2D includes illustrations of a semiconductive substrate forming process in accordance embodiment.

The buffer layer of the growth substrate can overlie the base substrate. Turning briefly to FIG. 2A, a semiconductive substrate 200 is illustrated in accordance with embodiment. Notably, the semiconductive substrate 200 can include a growth substrate 201 including a base substrate 202 and a buffer layer 203 overlying the base substrate 202. In particular, the buffer layer 203 can overlie an upper major surface of the base substrate 202, and more particularly, the buffer layer 203 can be in direct contact with upper major surface of the base substrate 202.

According to one embodiment, the growth substrate 201 may be obtained from a manufacturer, or alternatively, may be formed prior to conducting other processes. For example, the buffer layer 203 can be formed on the upper surface of the base substrate 202 using a deposition process. For example, the buffer layer 203 can be deposited on an upper major surface of the base substrate 202 within a reaction chamber. According to one process, the base substrate 202 can be loaded into a reaction chamber, and after providing a suitable environment within the reaction chamber, a buffer layer 203 can be deposited on the base substrate 202. According to one embodiment, a suitable deposition technique can include chemical vapor deposition. In one particular instance, the deposition process can include metalorganic chemical vapor deposition (MOCVD).

In certain instances, the buffer layer 203 may be formed from a plurality of films. For example, as illustrated in FIG. 2A, the buffer layer 203 can include a film 204 and a film 206. In accordance with an embodiment, at least one of the films 204 or 206, can include a crystalline material. In more particular instances, the film 204, which can be in direct contact with the surface of the substrate 201, can include silicon, and may consist essentially of silicon. The film 204 may facilitate separation between the substrate 201 and semiconductive layers overlying the film 204 as described herein.

As illustrated in FIG. 2A, the film 206 can overlie the film 204, and more particularly, can be in direct contact with the film 204. The film 206 can have suitable crystallographic features for epitaxial formation of layers thereon. Notably, in one embodiment the film 204 can include a semiconductive material. Suitable semiconductive material can include a Group 13-15 material. In one particular instance, the film 206 can include a nitride material. In another example, the film 206 can include gallium, aluminum, indium and a combination thereof. Still, in one particular embodiment, the film 206 can comprise aluminum nitride, and more particularly, may consist essentially of aluminum nitride.

Accordingly, in an exemplary structure, the buffer layer 203 can be formed such that the film 204 includes silicon and is directly contacting a major surface of the substrate 201. Furthermore, the film 206 can directly contact a surface of the film 204 and include aluminum nitride.

After providing a substrate at step 101, the process can continue at step 103 by forming a base layer overlying the growth substrate. Referring briefly to FIG. 2A, the semiconductive substrate 200 can include a base layer 205 overlying the growth substrate 201 that includes the base substrate 202 and the buffer layer 203. In particular, the base layer 205 can be formed such it is overlying a surface of the buffer layer 203, and more particularly, the base layer 205 can be in direct contact with the film 206 of the buffer layer 203.

According to an embodiment, upon suitably forming a buffer layer 203, the substrate 201 and buffer layer 203 may be placed within a reaction chamber to conduct a continuous growth process. A continuous growth process can include a process that is carried out in a single chamber, without removing the work piece (e.g., semiconductive substrate) from the chamber. A continuous growth process can also include a growth process, such as an epitaxial growth process, wherein a series of semiconductive layers can be formed without significant cooling of the work piece from the growth temperature, such that all layers can be formed with each other in-situ. A continuous growth process can further include a growth process wherein all semiconductive layers are formed using the same process (e.g., hydride vapor phase epitaxy), and within the same temperature, at substantially the same growth temperature.

In accordance with the embodiment, the continuous growth process can utilize an epitaxial growth process. More particularly, the continuous growth process can include hydride vapor phase epitaxy (HVPE). Accordingly, the base layer 205 can be formed through an epitaxial growth process, such as hydride vapor phase epitaxy (HVPE). Such a process may be particularly useful for forming a low defect density and thick base layer 205, and particularly, a base layer 205 having an average thickness greater than about 10-20 microns.

Alternatively, the base layer 205 can be formed using a deposition process, such as chemical vapor deposition. In one particular embodiment, the base layer 205 can be formed via metalorganic chemical vapor deposition (MOCVD). In particular instances, MOCVD may be used to form a particularly thin base layer 205, including for example, a base layer having an average thickness less than about 10 microns, and more particularly less than about 3 microns.

In one particular instance, the base layer 205 can be made of a Group 13-15 material. Some suitable Group 13-15 materials can include nitride materials. Furthermore, the base layer 205 may include gallium. In particular instances, the base layer 205 may include gallium nitride (GaN), and more particularly may consist essentially of gallium nitride.

Particular methods of forming the base layer 205 can be undertaken. For example, in utilizing a HVPE process, the formation of the base layer material can be conducted in various growth modes. For example, in one embodiment the base layer is initially formed as an epitaxial layer grown in a 3-dimensional (3D) growth mode. A 3D growth mode can include the simultaneous growth of the base layer 205 material along multiple crystallographic directions. In such instances, formation of the base layer 205 in a 3D growth process can include spontaneous formation of island features on the buffer layer 203. The spontaneously formed island features can be randomly positioned on the buffer layer 203, defining various mesas having multiple facets and valleys between the mesas.

Alternatively, or additionally, forming of the base layer 205 can include epitaxial growth in a 2-dimensional (2D) growth mode. A 2D growth mode is characterized by preferential growth of the material in one crystallographic direction and limited growth of the crystalline material along other crystallographic directions. For example, in one embodiment, formation of a base layer 205 comprising GaN in a 2D growth mode includes preferential growth of the GaN in the c-plane (0001), such that vertical growth of the base layer material is stabilized over lateral growth.

Still, forming of the base layer can incorporate a combination of 3D and 2D growth modes. For example, the base layer 205 may be initially formed in a 3D growth mode, wherein island features are spontaneously formed on the buffer layer 203 as a non-continuous layer of material. Following the 3D growth mode, growth parameters can be altered to change to a 2D growth mode, wherein vertical growth is accelerated over lateral growth. Upon switching from a 3D growth mode to a 2D growth mode, the spontaneously formed islands may coalesce into a continuous layer of uniform thickness. Combining 3D and 2D growth modes can facilitate formation of a base layer having desirable characteristics, such as a particular dislocation density.

Certain growth parameters include growth temperature, growth rate, pressure of vapor phase reactant and non-reactant materials, ratio of reactant and non-reactant materials in the reaction atmosphere, growth chamber pressure, and a combination thereof. Reference herein to a reactant material includes reactant materials such as nitrogen-containing materials, such as ammonia. Other reactant materials can include halide phase components, including for example, metal halide components such as gallium chloride. Non-reactant materials can include certain types of gases including for example noble gases, inert gases, and the like. In particular instances the non-reactant material can include gases such as nitrogen and or hydrogen.

During formation of the base layer 205, including production of the base layer 205 in a 3D growth mode, the growth temperature can be at least about 750° C. In other embodiments, the growth temperature can be greater, such as at least about 800° C., at least about 850° C., at least about 875° C., at least about 900° C., or even at least about 925° C. According to one method of forming, the growth temperature during formation of the base layer 205 can be not greater than about 1200° C., such as not greater than about 1150° C., not greater than about 1125° C., not greater than about 1050° C., or even not greater than about 1000° C. It will be appreciated that the growth temperature can be within a range between any of the minimum and maximum values noted above.

For certain processes, the growth temperature may be changed to facilitate a change between 3D and 2D growth modes. For example, in changing from 3D to 2D growth modes, the temperature may be changed by at least about 5° C., such as at least about 10° C., at least about 15° C., at least about 20° C., at least about 30° C., at least about 35° C., or even at least about 40° C. In still other embodiments, in changing from a 3D to 2D growth mode, the growth temperature can be changed by not greater than about 100° C., such as not greater than about 90° C., not greater than about 80° C., not greater than about 70° C., or even not greater than about 60° C. Change of the growth temperature can include an increase in the growth temperature in changing from 3D to 2D growth modes. It will be appreciated that the change in growth temperature can be within a range between any of the minimum and maximum values noted above.

In accordance with embodiment, the process of forming the base layer 205 can be conducted at a growth rate of at least 50 microns per hour. In other embodiments, the rate of forming the base layer 205 can be greater, such as at least about 75 micron per hours, at least about 100 microns per hour, at least about 150 microns per hour, at least about 200 microns per hour, or even at least about 250 microns per hour. Another embodiment, the process of forming the base layer 205 can be conducted at a rate of not greater than about 1 mm per hour, such as not greater than 750 microns per hour not greater 500 microns per hour, or even not greater than about 300 microns per hour. It will be appreciated the process of forming the base layer can be constructed at a rate within a range within any of the minimum maximum values noted above.

For certain processes, the growth rate may be changed to facilitate a change between 3D and 2D growth modes. For example, in changing from 3D to 2D growth, the growth rate may be changed by at least about 5 microns per hour, such as at least about 10 microns per hour, at least about 15 microns per hour, at least about 20 microns per hour, at least about 40 microns per hour, at least about 50 microns per hour, or even at least about 75 microns per hour. In still other embodiments, in changing from a 3D to 2D growth mode, the growth rate can be changed by not greater than about 200 microns per hour, such as not greater than about 175 microns per hour, not greater than about 150 microns per hour, not greater than about 125 microns per hour, or even not greater than about 100 microns per hour. It will be appreciated that the change in growth rate can be a decrease in the growth rate when changing from a 3D to a 2D growth mode. It will be appreciated that the change in growth rate can be within a range between any of the minimum and maximum values noted above.

According to other embodiments, the process of changing from 3D to 2D growth modes may be induced by a change in growth rate by at least a factor of 2. For example, the growth rate can be decreased by a factor of at least 2 in changing from a 3D growth mode to a 2D growth mode. In other embodiments, the growth rate can be decreased by a factor of at least about 3, at least about 4, or even at least about 5. In particular instances, the decrease in the growth rate is not greater than about a factor of 8, not greater than a factor of about 7, or not greater than a factor of about 6.

It will be appreciated that in changing the growth mode, one or more of the above-identified factors can be changed. For example, the growth temperature can be changed, while the growth rate is held steady. Alternatively, the growth rate can be changed while the growth temperature is maintained. And still, in another embodiment, both the growth rate and growth temperature may be changed to effectuate the change in growth modes.

The base layer 205 can be formed to have a particular thickness to facilitate further processes and the formation of a high quality material according to embodiments herein. For example, the base layer 205 may have an average thickness of not greater than about 5 mm. In other embodiments, the base layer 205 may have an average thickness of not greater than about 3 mm, such as not greater than about 2 mm, not greater than about 1 mm, not greater than about 0.5 mm, not greater than about 0.2 mm, not greater than about 100 microns, not greater than about 50 microns, not greater than about 1 micron, or even not greater than about 0.1 microns. Still, in other embodiments, the base layer 205 can be formed to have an average thickness of at least about 1 nm, such as at least about 10 nm, at least about 20 nm, at least about 50 nm, or even at least about 70 nm. It will be appreciated that the base layer 205 can be formed to have an average thickness within a range between any of the minimum and maximum values noted above.

The base layer 205 can be formed to have a particular dislocation density. The dislocation density of the base 205 can be measured at the upper surface of the base layer upon forming. A suitable method of measuring the dislocation density includes use of cathode luminescence microscopy operated at room temperature and polychromatic light detection without monochromator under 10 keVe-beam, spot size 70, wherein the machine is an SEM JSM-5510, commercially available from JEOL Corporation. For a dislocation density measurement of approximately $10^8$ cm$^{-2}$, the magnification is 4000× and the area is typically 700 μm$^2$. For a dislocation density measurement of approximately $10^6$ cm$^{-2}$, the magnification is typically 500-1000× and the area is typically 0.1 mm$^2$.

For example, the base layer 205 can have a dislocation of density not greater than about 1×10$^8$ dislocation/cm$^2$, as measured at an upper surface of the base layer 205. In other embodiments, the dislocation density of the base layer 205 can be less, such that it is not greater than about 1×10$^7$ dislocation/cm$^2$, not greater than about 6×10$^6$ dislocation/cm$^2$, or even not greater than about 1×10$^6$ dislocation/cm$^2$. Still, the base layer 205 may have a dislocation density that is at least about 1×10$^5$ dislocation/cm$^2$, such as at least 2×10$^5$ dislocation/cm$^2$, at least 3×10$^5$ dislocation/cm$^2$, or even at least 5×10$^5$ dislocation/cm$^2$. It will be appreciated that the base layer can have a dislocation density within a range within any of the minimum and maximum values noted above.

Referring again to FIG. 1, after forming a base layer overlying the buffer layer at step 103, the process can continue at step 105 by forming a mask overlying the base layer. The process of forming the mask can include the introduction of one or more particular chemical species within the growth chamber. According to a particular embodiment, the process of forming the mask can include providing a silicon-containing material within the growth chamber. In particular instances, the silicon-containing material can be provided in-situ within the growth chamber used during the growth process. More particularly, the silicon-containing material can be introduced during a growth process, wherein the growth of the base layer 205 can be interrupted to introduce the silicon-containing material.

In one embodiment, the silicon-containing material can include hydrogen. In certain processes, the silicon containing material can include a combination of silicon and hydrogen, including for example silane (SiH$_4$). More particularly, in one non-limiting embodiment, the silicon-containing material can consist essentially of silane.

In addition to the introduction of a silicon-containing material, other materials can be introduced to the growth chamber to facilitate forming a mask. For example, the growth chamber may include a nitrogen-containing material, and more specifically, a nitrogen-containing material including hydrogen. For example, the nitrogen-containing material can include ammonia (NH$_3$). In one particular embodiment, the nitrogen-containing material can consist essentially of ammonia. It will be appreciated that formation of the mask can be a result of a chemical reaction between the nitrogen-containing material and silicon-containing material. For example, in one particular instance, the silicon-containing material can react with the nitrogen-containing material to form a silicon nitride (SiNx) material, and wherein the mask can comprise silicon nitride.

Figure 2B:
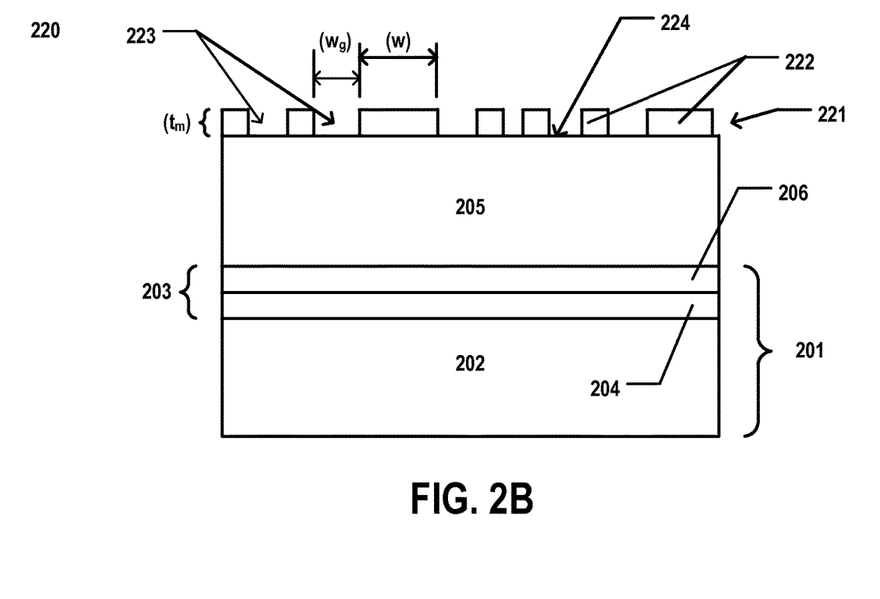

Referring briefly to FIG. 2B, a cross-sectional illustration of a portion of a semiconducting substrate during processing according to an embodiment is provided. As illustrated, the semiconducting substrate 220 can include a growth substrate 201, a base layer 205 overlying the growth substrate 201, and a mask 221 having mask regions 222 and gap regions 223 overlying an upper surface 224 of the base layer 205. In accordance with an embodiment, the mask 221 can be formed at a temperature substantially close to the growth temperature utilized in formation of the base layer 205. For example, the process of forming the mask can be conducted at a temperature with 800° C. of the growth temperature utilized in forming of the base layer 205. In other embodiments, the process of forming the mask can be conducted at a temperature that is within 600° C. of the growth temperature, such as within at least 500° C. of the growth temperature, within at least about 400° C. of the grown temperature, within at least 300° C. of the growth temperature, or even within at least about 200° C. of the growth temperature.

In accordance with an embodiment, the mask regions 222 can be include silicon and nitrogen. In one instance, the mask regions 222 can be formed of silicon nitride (SiNx), and in particular, the mask regions 222 may consist essentially of silicon nitride.

As further illustrated, the mask regions 222 can be formed in a manner such that they have a random orientation relative to each other. For example, the mask regions 222 can be essentially free of short range order or long range ordering. More particularly, the mask regions 222 can be arranged relative to each other such that there is no discernable pattern or repeating arrangement. Moreover, the mask regions 222 can have a random spacing between each other, as defined by the size of the gap regions 223.

The mask regions 222 can have various sizes relative to each other and relative to any crystallographic directions of the base layer 205. For example, each mask region may have a width (W) of at least about 0.5 nm or at least about 1 nm. Each mask region may have a width (W) of submicron size, for example, not greater than about 0.8 microns, not greater than about 0.5 microns, or even not greater than about 0.1 microns. It will be appreciated that the majority of mask regions 222 can have a size within a range between any of the minimum and maximum values noted above Furthermore, the mask regions 222 can be defined by gap regions 223 extending between the mask regions 222 and defining openings wherein the upper surface 224 of the base layer 225 may be exposed, and not covered by mask regions 222. The gap regions 223 can be arranged randomly relative to each other on the surface 224 of the base layer 205. That is, in particular instances, the gap regions 223 can have various widths and orientations relative to each other. The gap regions 223 can also have random orientations relative to one or more crystallographic directions of the base layer 205, such that the gap regions do not necessarily align with any crystallographic directions or planes of the base layer.

In accordance with an embodiment, each of the gap regions 223 can have a width ($W_g$) of at least about 0.5 nm or at least about 1 nm. Each gap region may have a width ($W_g$) of submicron size, for example, not greater than about 0.8 microns, not greater than about 0.5 microns, or even not greater than about 0.1 microns. It will be appreciated that the majority of gap regions 223 can have a size within a range between any of the minimum and maximum values noted above In another embodiment, the mask 221 can be formed such that mask regions 222 have a particular average thickness ($t_m$). In accordance with an embodiment, the mask regions 222 can be formed to have an average thickness that is less than the average thickness of the base layer ($t_b$). In other instances, the mask regions 222 can be formed to have an average thickness that is less than about 0.5 microns, such as less than about 0.3 microns, less than about 0.1 microns, or even less than about 0.08 microns. The mask regions 222 can have an average thickness of at least about 0.001 microns. In accordance with an embodiment, the mask regions 222 can have an average thickness within a range between any of the minimum and maximum values noted above.

In accordance with an embodiment, the process of forming the mask 221 can be conducted for a particular duration.

For example, the duration can include a time suitable for the introduction of materials used to form the mask 221. As such, in at least one embodiment, the process of forming the mask 221 can last for a duration of not greater than about 60 min, such as not greater than about 20 min, not greater than about 10 min, or even not greater than about 5 min.

Furthermore, other processing conditions within the growth chamber may be controlled to facilitate proper formation of the mask 221. For example, the pressure within the growth atmosphere during formation of the mask can be within a range between about 50 and about 800 Ton.

After forming a mask at step 105, the process can continue at step 107 by preferentially removing a portion of the base layer. In accordance with an embodiment, the process of preferentially removing a portion of the base layer can include an etching process. In accordance with one embodiment, the etching process can include the incorporation of an etchant material within the growth chamber. Some suitable etchant materials can include compositions including a halogen element, and more particularly chlorine. In other embodiments, the etchant material may include hydrogen. In an exemplary embodiment, the etchant material can include hydrogen chloride (HCl), and more particularly, may consist essentially of hydrogen chloride.

In some instances, the etchant material may include a combination of materials. For example, the etchant material can include a combination of hydrogen chloride and a nitrogen-containing material. One suitable nitrogen-containing material can include ammonia ($NH_3$). It will be appreciated that in particular instances the etchant material may be introduced in the growth chamber as a gas-phase species. Still, in other embodiment, the etchant material may be a liquid-phase species, depending upon the processing conditions.

According to one embodiment, the process of preferentially removing a portion of the base layer can be conducted at a temperature that is substantially the same as the growth temperature. In other embodiments, the process of preferentially removing a portion of the base layer can be conducted at elevated temperatures, and more notably, temperatures close to the growth temperature utilized in forming the base layer 205. For example, the process of preferentially removing can be conducted at a temperature within 800° C. of the growth temperature, such as within 600° C. of the growth temperature, within 500° C. of the growth temperature, within 400° C. of the growth temperature, within 300° C. of the growth temperature, within 200° C. of the growth temperature, within 100° C. of the growth temperature, or even within 50° C. of the growth temperature. In one non-limiting embodiment, the process of preferentially removing a portion of the base layer can be conducted at a temperature between 600° C. and 1100° C.

As noted herein, the process of preferentially removing a portion of the base layer can include an etching operation. Notably, the etching process may selectively remove portions of the base layer 205. In accordance with an embodiment, the process of etching can last for a duration not greater than about 2 hours, such as not greater than about 100 min, not greater than about 90 min, not greater than about 70 min, not greater than about 60 min., not even not greater than 30 min, not even not greater than 10 min, or not even not greater than 1min Notably, the duration of etching may depend upon certain other factors, including, for example the concentration of etchant material within the growth chamber.

Figure 2C:
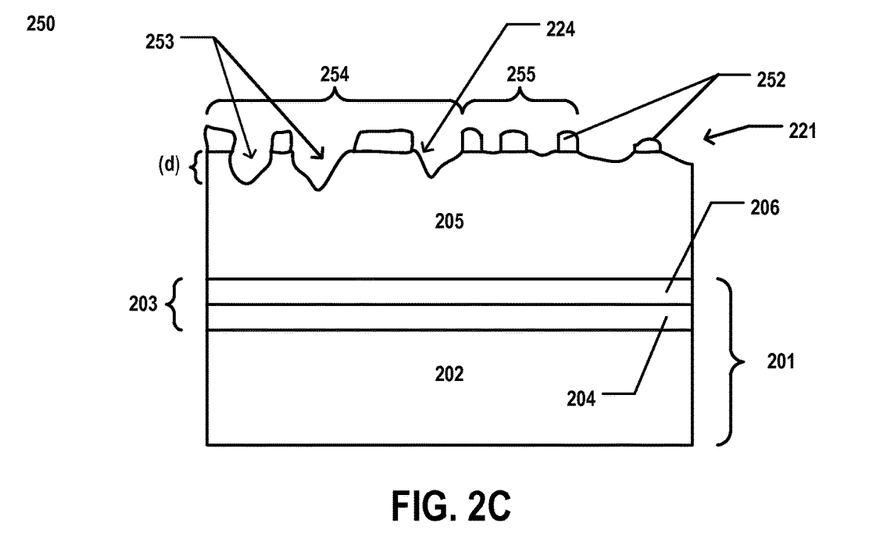

FIG. 2C includes a cross-sectional view of a semiconductor substrate after conducting a process of preferentially removing a portion of the base layer in accordance with an embodiment. As illustrated, the semiconductor substrate 250 can include a growth substrate 201, a base layer 205 overlying the growth substrate 201 and a mask 221 overlying the base layer 205. As illustrated, the process of preferentially removing a portion of the base layer 205 can include the formation of pits 253 in an upper surface 224 of the base layer 205. In accordance with an embodiment, the pits 253 can be formed to have a certain depth depending upon the processing conditions. In particular instances, the pits 253 can have various depths compared to each other, depending upon the processing conditions.

According to one non-limiting embodiment, the pits 253 can have an average depth (d) less than an average thickness ($t_b$) of the base layer 205. In particular instances, the pits 253 can be formed to have an average depth less than about 10 microns, such as less than about 8 microns, less than about 5 microns, less than about 2 microns, less than about 1 micron, less than about 0.8 microns, less than about 0.5 microns, or even less than about 0.5 microns or even less than about 0.2 microns. Still, the average depth of the pits 253 can be at least about 1 nm. It will be appreciated that the depth of the pits 253 can be within a range between any of the minimum or maximum values above.

In certain other instances, while not illustrated in FIG. 2C, at least a portion of the pits 253 may extend for an entire thickness of the base layer 205. That is, for example, during the process of preferentially removing a portion of the base layer 205, in some areas, substantially all of the base layer can be removed until a portion of the underlying buffer layer 203 is exposed. In more particular instances, the buffer layer 203 can function as an etch-stop layer, limiting the depth of the pits 253 when the etchant material reaches the buffer layer 203. Such embodiments may be particularly suited to a base layer 205 having a particular thickness, for example, a base layer 205 having an average thickness of less than about 10 microns, such as less than about 5 microns, less than about 1 micron, or even less than about 0.1 microns. Notably, in particular instances, the etching process can be conducted such that the pits 253 can have a depth (d) that is substantially equivalent to (within 10% of a measurement or even within 5% of a measurement) of the average width of the mask regions 222 and the gap regions 223.

The process of preferentially removing a portion of the base layer 205 can include preferential removal of portions of the upper surface 224 of the base layer 205. More particularly, the process of preferentially removing can include the preferential removal of high dislocation density regions 254 at the upper surface 224 of the base layer 205. For example, the etchant material can preferentially remove regions at the upper surface 224 of the base layer 205 having a higher dislocation density (i.e., a higher concentration of defects) as compared to regions 225 of the upper surface 224 of the base layer 205 having a lower concentration of defects (i.e., low dislocation density regions). As such, the process of preferentially removing can remove highly defected regions in the upper surface 224, facilitating the formation of a new (e.g., etched) upper surface of the base layer 205 having a significantly lower concentration of defects in totality as compared to the upper surface 224 prior to the process of selectively removing.

In accordance with an embodiment, the process of preferentially removing a portion of the base layer 205 can also include preferentially removing portions of the mask 221, and more notably, portions of the mask regions 222. For example, as illustrated in FIG. 2C, within regions 254 having high dislocation densities, portions of the mask regions (previously illustrated as mask regions 222) within the region 254 can be removed, such that mask portions 252 remain after processing. As illustrated in FIG. 2C, mask portions 252 represent mask regions 222 that have been at least partially removed and reduced in size due to the process of selectively removing a portion of the base layer 205.

The process of preferentially removing a portion of the base layer can include anisotropic etching of the upper surface 224 such that regions having high dislocation density are preferentially removed before regions having lower dislocation densities. As further illustrated in FIG. 2c the process of preferentially removing a portion of the base layer can include an isotropic etching process wherein portions of the base layer 205 underlying mask regions 222 can be removed. For example, the etchant material may preferentially remove portions of the base layer 205 before removing mask portions 252 such that the mask portions 252 may extend over and cover regions in the base layer 205 where the material has been completely removed.

Referring again to FIG. 1, after preferentially removing a portion of the base layer at step 107, the process can continue at step 109 by forming an epitaxial layer. The epitaxial layer can be formed such that it is overlying the mask portions 252 and the base layer 205. More particularly, the epitaxial layer can be formed such that it is epitaxially grown from the modified (e.g., etched) upper surface of the base layer 205 after processing. In particular, the epitaxial layer can be formed from regions of the base layer 205 having significantly low dislocation densities because the process of preferentially removing eliminated a substantial portion of high dislocation density regions of the base layer 205.

Figure 2D:
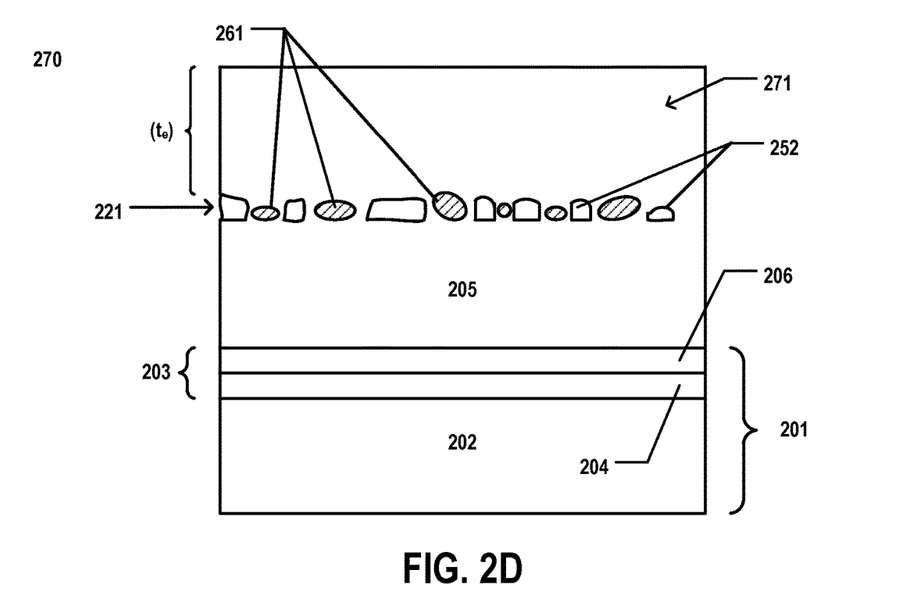

Referring to FIG. 2D, an epitaxial layer 271 is illustrated as being formed over the release base layer 205 and mask portions 252. In particular instances, the epitaxial layer 271 can be formed such as it is directly contacting the upper surface of the base layer 205 between the mask portions 252. The epitaxial layer 271 can be initially grown from the pits 253 formed in the surface of the base layer 205. As further illustrated, during initial stages of growth of the epitaxial layer 217, voids 261 can be formed between the mask portions 252. The voids may be, but not necessarily, present in the final article.

The process of forming the epitaxial layer 271 can include an epitaxial growth process utilizing one or more growth modes as noted herein. For example, formation of the epitaxial layer 271 can include formation through a 3D growth mode, a 2D growth mode, or a combination of 3D and 2D growth modes. In one embodiment, the formation of the epitaxial layer 271 is completed entirely in a 2D growth mode.

Forming of the epitaxial layer 271 can be conducted via a continuous growth process, such that the epitaxial layer 271 is formed in-situ with the other semiconductive layers (e.g., the base layer 205). Notably, the process can be continuous and conducted within the same growth chamber during formation of the base layer 205, to formation of the mask 221, and further to formation of the epitaxial layer 271.

In accordance with embodiment, the epitaxial layer 271 can include a Group 13-15 material. In particular instances, the epitaxial layer can include a nitride material. In still another embodiment, the epitaxial layer can include gallium, and more particularly, may include gallium nitride. Certain epitaxial layers may consist essentially of gallium nitride.

In one embodiment, the epitaxial layer 271 can be grown at substantially the same rate as the base layer 205. The epitaxial layer 271 may be formed such it has an average thickness ($t_e$) that is at least the same as the base layer 205, and may have an average thickness that is significantly greater than the average thickness than the base layer 205. For example, the epitaxial layer 271 can be formed such as it has an average thickness of at least about 5 microns. In other embodiments, the average thickness may be greater, such as at least about 10 microns, at least about 50 microns, at least about 100 microns, at least about 200 microns, at least about 400 microns, at least about 500 microns, or even at least about 800 microns. Still, the epitaxial layer 271 may be formed such that it has an average thickness that is not greater than about 10 mm, such as it is not greater about 5 mm, not greater than about 3 mm, or even not greater than about 2 mm. It will be appreciated that the epitaxial layer 271 can have an average thickness within a range between any of the minimum and maximum values noted above.

The epitaxial layer 271 may be formed to have a particular dislocation density as measured in upper surface. For example, the epitaxial layer 271 can have a dislocation density that is not greater than about $1 \times 10^8$ dislocations/cm$^2$, such as not greater than about $1 \times 10^7$ dislocations/cm$^2$, or even not greater than about $1 \times 10^6$ dislocations/cm$^2$. In other embodiments, the epitaxial layer 271 can have a dislocation density that is at least about $1 \times 10^5$ dislocations/cm$^2$, such as at least $2 \times 10^5$ dislocations/cm$^2$, or even at least $5 \times 10^5$ dislocations/cm$^2$. It will be appreciated that the epitaxial layer 271 can have a dislocation density within a range between any of the minimum and maximum values noted above.

During the process of forming, including for example, the base layer 205, mask 221, and epitaxial layer 271, the growth substrate 201 may be separated from the base layer 205. The separation can be facilitated by the dissociation of a portion of the buffer layer 203, and particularly, a film within the buffer layer 203. In accordance with an embodiment, the buffer layer 203 can include a film, such as silicon, wherein at elevated temperatures utilized during the continuous growth process, the film is thermally dissociated. Thermal dissociation facilitates separation between the substrate 201 and the plurality of semiconductive layers. Accordingly, upon completion of the continuous growth process, the base layer 205, mask 221, and epitaxial layer 271 can be completely removed from the substrate 201.

EXAMPLE

A sample is formed according to an embodiment by first growth of a two part buffer layer via MOVPE on a sapphire substrate. The buffer layer includes a first layer of silicon directly on the sapphire substrate, followed by epitaxial growth of AlN. After loading the sapphire substrate in the MOVPE reactor, the sapphire substrate has to be annealed under $N_2$ before growth of the silicon film. Preferably the temperature 870° C. Silicon growth is formed from pyrolysis of silane in the $N_2$ atmosphere at 100 Torr to a thickness of about 0.4 microns.

The temperature is raised to about 1140° C., the growth vapor still being pure $N_2$ at 70 torrs. $NH_3$ is first introduced into the reaction chamber, and thereafter, a TMAl organometallic material is introduced to begin forming the AlN layer on the silicon. After approximately 20 minutes of growth, a 0.2 μm thick AlN layer is deposited on top of the Si layer, forming the buffer layer.

A base layer of about 3-10 microns thick is formed using MOCVD on the buffer layer. After forming the base layer, a SiNx mask is formed by simultaneously introducing silane (SiH$_4$) and NH$_3$ at approximately 1000° C. into the growth chamber for approximately 30 minutes. The growth chamber is first purged of gaseous components used to grow the GaN base layer. The mask is in the form of a SiNx nanonet characterized by mask regions of various sizes, shapes, and orientations relative to each other. The gap regions in the mask are approximately 1 nanometer to 100 nanometers in size. The mask regions have a thickness between approximately 1 and 50 nanometers.

After forming the mask, the wafer is brought in the HVPE growth chamber and an etching process is conducted using HCl. Some $NH_3$ may be present in the growth chamber. The etching process preferentially removes regions of the upper surface of the base layer having a greater concentration of dislocations as compared to regions of the upper surface of the base layer having a lower concentration of dislocations. Etching is conducted at approximately 400 to 1000° C., for a duration of about 1 to 10 min, removing less than about 1 micron in depth of GaN from the surface of the base layer. The buffer layer acted like an etch stop layer for certain pits formed in the base layer beneath the mask of significant depth.

After etching process, a porous GaN upper surface of the base layer is created with a skeleton of high quality GaN with low dislocation densities. An epitaxial layer is formed via HVPE in the gap regions of the mask (i.e., the openings) from the low dislocation density regions. The epitaxial layer is formed using the same parameters used to growth the GaN base layer, including at least one alternation between 3D and 2D growth modes, including for example, using at least in part, the following sequence: 350 µm 3D+50 µm 2D+350 µm 3D+50 µm 2D+200 µm 3D. The epitaxial layer is formed to have a thickness of at least 1 mm.

The embodiments herein represent a departure from the state-of-the-art. While certain ELO growth processes have utilized masks in the past, such masks have a been formed through particular techniques, including photolithography, to facilitate the formation of masks having precisely formed openings with controlled pitch parameters and alignment with crystallographic directions of the underlying material (e.g., sapphire or GaN). The present application discloses a process for forming a compound semiconductive substrate including a plurality of layers, and an intervening mask, formed in the middle of the growth process, which is used to improve the quality of the final epitaxial layer. Notably, the method of forming the mask and the process of preferentially removing portions of the underlying layer after forming the mask can be conducted in a manner to streamline processing and further improve the quality of the finally-formed epitaxial layer. The processes of the embodiments herein utilize a particular combination of growth parameters, including growth rate, ratio of reactant materials, ratio of non-reactant materials, growth modes, growth temperatures, growth pressure, material components, mask-forming conditions, and etching conditions.

In the foregoing, reference to specific embodiments and the connections of certain components is illustrative. It will be appreciated that reference to components as being coupled or connected is intended to disclose either direct connection between said components or indirect connection through one or more intervening components as will be appreciated to carry out the methods as discussed herein. As such, the above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description, with each claim standing on its own as defining separately claimed subject matter.

What is claimed is:

1. A method of forming a semiconductor substrate comprising:
    providing a growth substrate including a buffer layer and a base substrate, wherein providing the growth substrate comprises forming the buffer layer overlying the base substrate;
    forming a base layer of a Group 13-15 material on the growth substrate during a growth process at a growth temperature, wherein the buffer layer is between the base layer and the base substrate;
    forming a mask comprising mask regions and gap regions overlying the base layer during the growth process, wherein:
        the mask comprises a silicon containing material;
        the mask regions have a random orientation and random sizes relative to each other; and
        a majority of the gap regions have a width of not greater than 0.8 microns;
    preferentially removing a portion of the base layer underlying the mask during the growth process and after forming the mask comprising the mask regions and gap regions, wherein preferentially removing a portion of the base layer is conducted until a portion of the buffer layer is exposed, and wherein the buffer layer is an etch-stop layer;
    forming an epitaxial layer overlying the mask and the base layer, wherein the epitaxial layer comprises a Group 13-15 material; and
    separating the base layer, mask, and epitaxial layer from the growth substrate during forming of at least one of the base layer, mask, and epitaxial layer, wherein separating comprises thermal decomposition of at least a portion of the buffer layer between the base substrate and the base layer.

2. The method of claim 1, wherein the base substrate includes sapphire.

3. The method of claim 1, wherein forming the base layer comprises hydride vapor phase epitaxy (HVPE).

4. The method of claim 1, wherein the base layer comprises a nitride material.

5. The method of claim 1, wherein forming the base layer is conducted at a rate of at least about 50 microns/hr.

6. The method of claim 1, wherein forming the base layer comprises a spontaneous formation process comprising the formation of island features including a semiconductive material, and coalescence of the island features into a continuous layer of the semiconductive material.

7. The method of claim 1, wherein the mask regions comprise silicon nitride (SiNx).

8. The method of claim 1, wherein preferentially removing a portion of the base layer comprises etching.

9. The method of claim 1, wherein preferentially removing a portion of the base layer comprises etching and is conducted within 200° C. of the growth temperature.

10. The method of claim 1, wherein preferentially removing comprises anisotropic etching of a portion of an upper surface of the base layer having a higher concentration of defects as compared to a region of the upper surface having a lower concentration of defects.

11. A method of forming a semiconductor substrate comprising:
    providing a growth substrate including a buffer layer and a base substrate, wherein providing the growth substrate comprises forming the buffer layer overlying the base substrate;
    forming a base layer of a Group 13-15 material on a growth substrate overlying the buffer layer at a growth temperature;
    forming a mask comprising a nitride material overlying the base layer, wherein the mask comprises mask regions and gap regions, mask regions having a random orientation and random sizes relative to each other and a majority of the gap regions having a width of not greater than 0.8 microns;
    etching and preferentially removing portions of the base layer and the mask after forming the mask, wherein etching and preferentially removing portions of the base layer is conducting until a portion of the buffer layer is exposed, and the buffer layer is an etch-stop layer, wherein forming the base layer, forming the mask and etching and preferentially removing are conducted in-situ during a single operation within a growth chamber;
    forming an epitaxial layer overlying the mask and the base layer, wherein the epitaxial layer comprises a Group 13-15 material; and
    separating the base layer, mask, and epitaxial from the growth substrate during forming of at least one of the base layer, mask, and epitaxial layer, wherein separating comprises thermal decomposition of at least a portion of the buffer layer.

12. A method of forming a semiconductor substrate comprising:
    forming a base layer at a base layer growth temperature comprising GaN on a growth substrate during a growth process, the growth substrate comprising:
        a sapphire base substrate; and
        a buffer layer overlying the sapphire base substrate and disposed between the base substrate and the base layer;
    forming a mask comprising mask regions and gap regions between the mask regions overlying the base layer, wherein:
        the mask regions have a random orientation and random sizes relative to each other;
        a majority of the gap regions have a width of not greater than 0.8 microns; and
        forming the mask comprising mask regions and gap regions is conducted within 200° C. of the growth temperature;
    preferentially removing a portion of the base layer underlying the mask after forming the mask, wherein removing a portion of the base layer is conducted until a portion of the buffer layer is exposed, wherein the buffer layer is an etch-stop layer;
    forming an epitaxial layer overlying the mask and the base layer, wherein the epitaxial layer comprises a Group 13-15 material; and
    separating the base layer, mask, and epitaxial layer from the growth substrate during forming of at least one of the base layer, mask, and epitaxial layer, wherein separating comprises thermal decomposition of at least a portion of the buffer layer between the base substrate and the base layer.

13. The method of claim 1, wherein forming the mask is conducted within 200° C. of the growth temperature.

14. The method of claim 1, wherein preferentially removing a portion of the base layer is conducted within 200° C. of the growth temperature.

15. The method of claim 11, wherein the mask comprises mask regions and gap regions overlying the base layer, the mask regions having a random orientation and random sizes relative to each other, and the gap regions having random sizes relative to each other.

16. The method of claim 15, wherein each of the mask regions has a width of at least about 0.5 nm and not greater than 0.8 microns.

17. The method of claim 11, wherein forming the mask is conducted within 200° C. of the growth temperature.

18. The method of claim 11, wherein etching and removing a portion of the base layer is conducted within 200° C. of the growth temperature.

19. The method of claim 12, wherein removing a portion of the base layer underlying the mask is conducted within 200° C. of the growth temperature.

\* \* \* \* \*